(12) United States Patent
Seo et al.

(10) Patent No.: US 11,581,253 B2
(45) Date of Patent: Feb. 14, 2023

(54) SEMICONDUCTOR DEVICE

(71) Applicant: SAMSUNG ELECTRONICS CO., LTD., Suwon-si (KR)

(72) Inventors: Donghee Seo, Suwon-si (KR); Heonbok Lee, Suwon-si (KR); Tae-Yeol Kim, Hwaseong-si (KR); Daeyong Kim, Yongin-si (KR); Dohyun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/503,723

(22) Filed: Oct. 18, 2021

(65) Prior Publication Data
US 2022/0044993 A1 Feb. 10, 2022

Related U.S. Application Data

(63) Continuation of application No. 16/893,540, filed on Jun. 5, 2020, now Pat. No. 11,152,297.

(30) Foreign Application Priority Data
Nov. 28, 2019 (KR) .................. 10-2019-0155625

(51) Int. Cl.
*H01L 23/498* (2006.01)
*H01L 29/78* (2006.01)

(52) U.S. Cl.
CPC .. *H01L 23/49844* (2013.01); *H01L 23/49811* (2013.01); *H01L 29/78* (2013.01)

(58) Field of Classification Search
CPC ............... H01L 29/78; H01L 23/49811; H01L 23/49844
(Continued)

(56) References Cited

U.S. PATENT DOCUMENTS

| 5,227,191 A | 7/1993 | Nagashima |
| 5,714,804 A | 2/1998 | Miller et al. |

(Continued)

FOREIGN PATENT DOCUMENTS

| JP | 2013-143485 A | 7/2013 |
| KR | 10-0257156 B1 | 5/2000 |

(Continued)

*Primary Examiner* — Monica D Harrison
(74) *Attorney, Agent, or Firm* — Lee IP Law, P.C.

(57) ABSTRACT

A semiconductor device including an interlayer insulating layer on a substrate; a conductive line on the interlayer insulating layer; and a contact plug penetrating the interlayer insulating layer, the contact plug being connected to the conductive line, wherein the contact plug includes an upper pattern penetrating an upper region of the interlayer insulating layer, the upper pattern protruding upwardly from a top surface of the interlayer insulating layer, the upper pattern includes a first portion penetrating the upper region of the interlayer insulating layer; and a second portion protruding upwardly from the top surface of the interlayer insulating layer, and a width of a lower region of the second portion in a direction parallel to a top surface of the substrate is greater than a width of an upper region of the second portion in the direction parallel to the top surface of the substrate.

20 Claims, 19 Drawing Sheets

(58) Field of Classification Search
USPC .......................................................... 257/288
See application file for complete search history.

(56) References Cited

U.S. PATENT DOCUMENTS

| | | | |
|---|---|---|---|
| 7,008,871 | B2 | 3/2006 | Andricacos et al. |
| 7,879,720 | B2 | 2/2011 | Jang et al. |
| 9,356,149 | B2 | 5/2016 | Kamineni et al. |
| 10,177,028 | B1 | 1/2019 | LiCausi et al. |
| 10,361,120 | B2 | 7/2019 | Wang et al. |
| 10,580,876 | B2 * | 3/2020 | Ahn .................. H01L 21/76897 |
| 2014/0001625 | A1 | 1/2014 | Han et al. |
| 2015/0228793 | A1 | 8/2015 | Chen et al. |
| 2017/0222014 | A1 | 8/2017 | Tak et al. |
| 2018/0308797 | A1 | 10/2018 | Tsai et al. |

FOREIGN PATENT DOCUMENTS

| | | |
|---|---|---|
| KR | 10-2007-0030428 A | 3/2007 |
| KR | 10-0909176 B1 | 7/2009 |

* cited by examiner

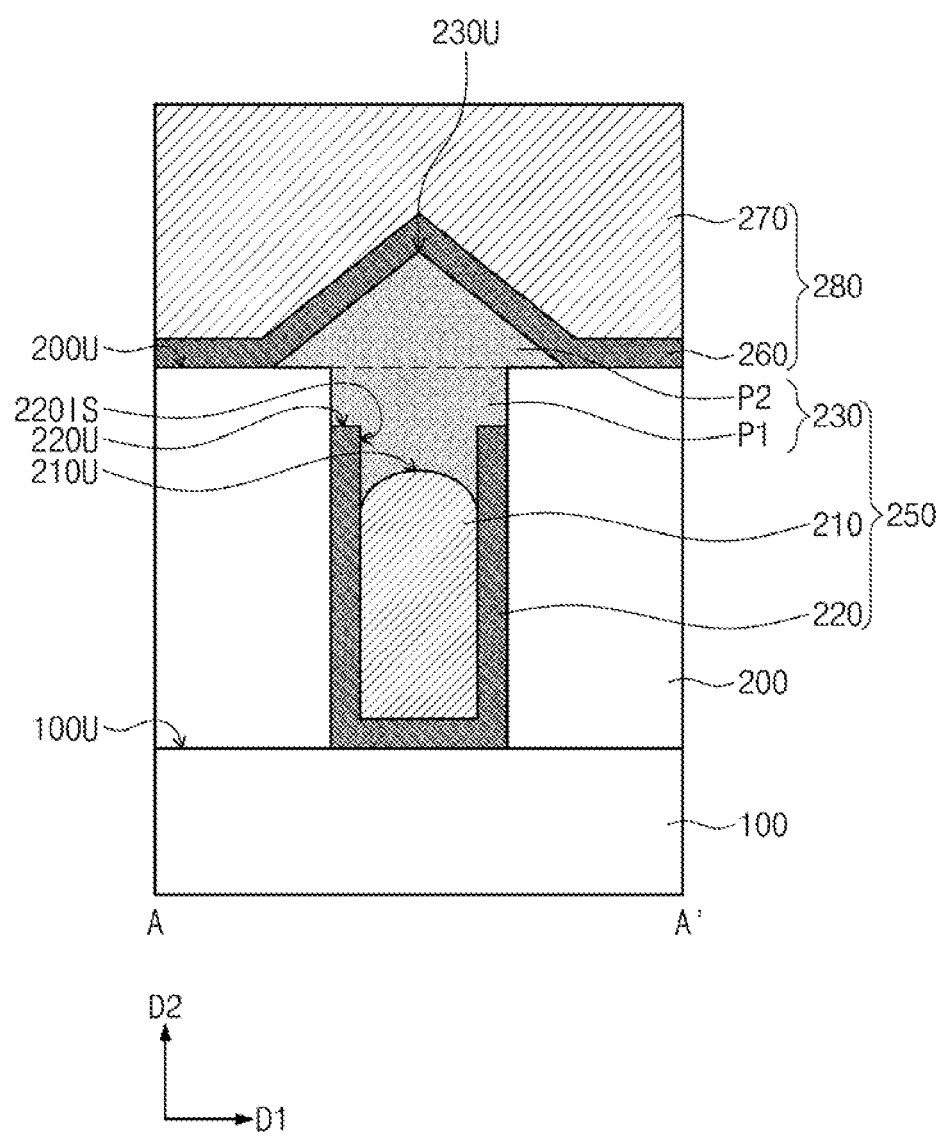

SEMICONDUCTOR DEVICE

CROSS-REFERENCE TO RELATED APPLICATIONS

This is a continuation application based on pending application Ser. No. 16/893,540, filed Jun. 5, 2020, the entire contents of which is hereby incorporated by reference.

Korean Patent Application No. 10-2019-0155625, filed on Nov. 28, 2019, in the Korean Intellectual Property Office, and entitled: "Semiconductor Device," is incorporated by reference herein in its entirety.

BACKGROUND

1. Field

Embodiments relate to a semiconductor device.

2. Description of the Related Art

Semiconductor devices may include integrated circuits including metal-oxide-semiconductor field effect transistors (MOSFETs). As sizes and design rules of semiconductor devices have been reduced, MOSFETs have been scaled down.

SUMMARY

The embodiments may be realized by providing a semiconductor device including an interlayer insulating layer on a substrate; a conductive line on the interlayer insulating layer; and a contact plug penetrating the interlayer insulating layer, the contact plug being connected to the conductive line, wherein the contact plug includes an upper pattern penetrating an upper region of the interlayer insulating layer, the upper pattern protruding upwardly from a top surface of the interlayer insulating layer, the upper pattern includes a first portion penetrating the upper region of the interlayer insulating layer; and a second portion protruding upwardly from the top surface of the interlayer insulating layer, and a width of a lower region of the second portion in a direction parallel to a top surface of the substrate is greater than a width of an upper region of the second portion in the direction parallel to the top surface of the substrate.

The embodiments may be realized by providing a semiconductor device including a gate structure on a substrate; a lower contact plug at a side of the gate structure and connected to the substrate; a lower interlayer insulating layer covering the gate structure and the lower contact plug; an upper interlayer insulating layer on the lower interlayer insulating layer; and a contact plug penetrating the upper interlayer insulating layer so as to be connected to the lower contact plug, wherein the contact plug includes an upper pattern penetrating an upper region of the upper interlayer insulating layer, the upper pattern protruding upwardly from a top surface of the upper interlayer insulating layer.

The embodiments may be realized by providing a semiconductor device an interlayer insulating layer on a substrate; a conductive line on the interlayer insulating layer; and a contact plug penetrating the interlayer insulating layer, the contact plug being connected to the conductive line, wherein the contact plug includes a protrusion protruding upwardly from a top surface of the interlayer insulating layer, the protrusion covers a portion of the top surface of the interlayer insulating layer, and a width of a lower region of the protrusion in a direction parallel to a top surface of the substrate is greater than a width of an upper region of the protrusion in the direction parallel to the top surface of the substrate.

BRIEF DESCRIPTION OF THE DRAWINGS

Features will be apparent to those of skill in the art by describing in detail exemplary embodiments with reference to the attached drawings in which:

FIGS. 3A, 3B and 4 to 6 are cross-sectional views corresponding to the line A-A' of FIG. 1 to illustrate semiconductor devices according to some embodiments.

DETAILED DESCRIPTION

Figure 1:
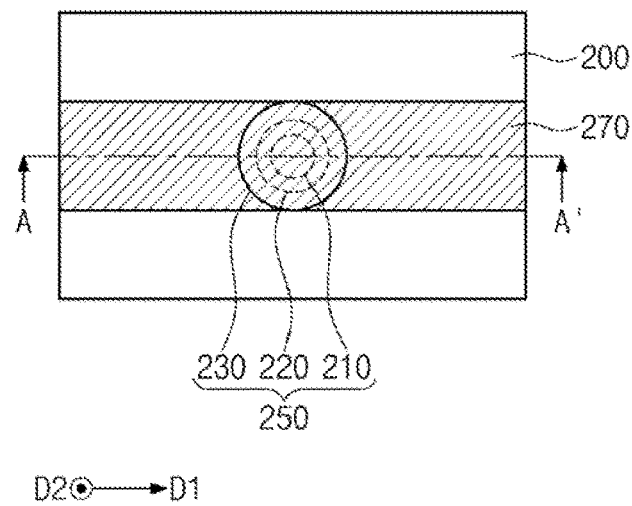
FIG. 1 is a plan view of a semiconductor device according to some embodiments.
Figure 2:
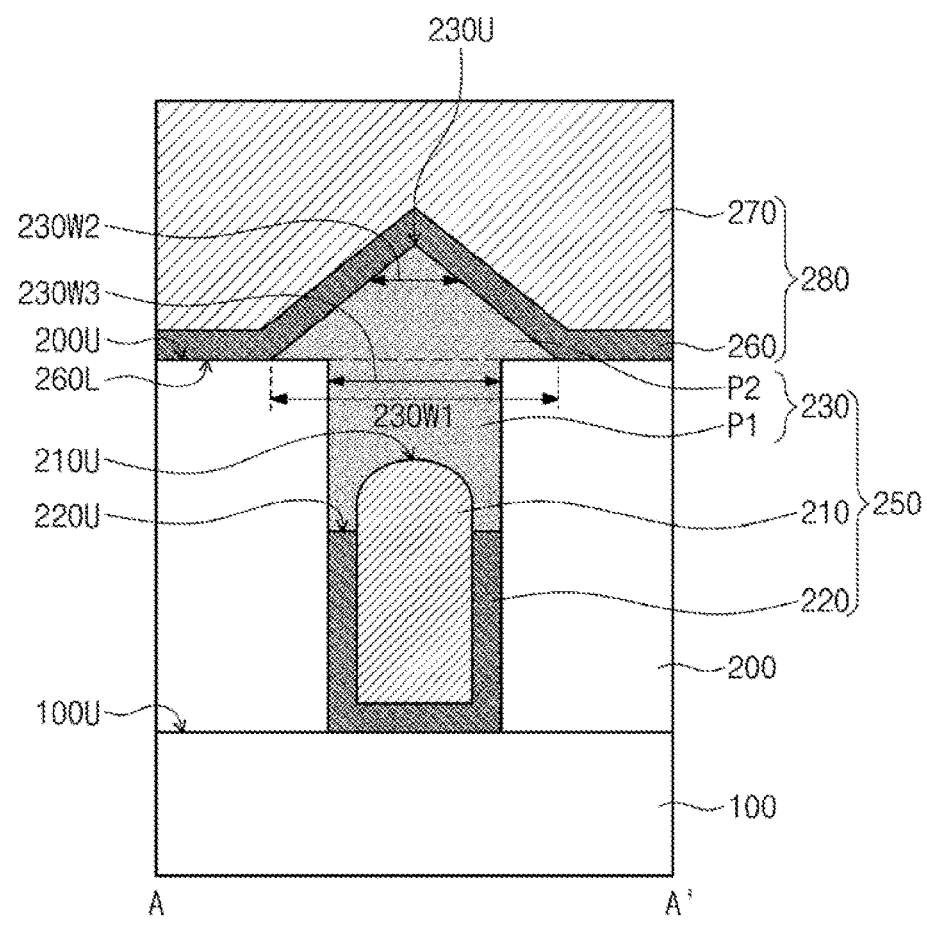
FIG. 2 is a cross-sectional view taken along a line A-A' of FIG. 1.

FIG. 1 is a plan view illustrating a semiconductor device according to some embodiments. FIG. 2 is a cross-sectional view taken along a line A-A' of FIG. 1.

Referring to FIGS. 1 and 2, an interlayer insulating layer 200 may be on a substrate 100. The substrate 100 may be a semiconductor substrate. In an implementation, the substrate 100 may be a silicon substrate or a silicon-on-insulator (SOI) substrate. In an implementation, the interlayer insulating layer 200 may include a silicon oxide layer, a silicon nitride layer, a silicon oxynitride layer, or a low-k dielectric layer. In an implementation, the substrate 100 may include planar field effect transistors (planar FETs) having a planar channel structure, fin FETs having a three-dimensional (3D) channel structure, multi-bridge channel FETs (MBC FETs) having a 3D channel structure, gate-all-around FETs (GAA FETs) having a 3D channel structure, vertical FETs having a vertical channel structure, or negative capacitance FETs (NC FETs) using a negative capacitance. The interlayer insulating layer 200 may be on the transistors. As used herein, the term "or" is not an exclusive term, e.g., "A or B" would include A, B, or A and B.

A conductive line 280 may be on the interlayer insulating layer 200. A contact plug 250 may penetrate the interlayer insulating layer 200 and may be connected to the conductive line 280. In an implementation, the conductive line 280 may extend (e.g., lengthwise) in a first direction D1 parallel to a top surface 100U of the substrate 100.

The contact plug 250 may include a lower pattern 210 (penetrating a lower portion or region of the interlayer insulating layer 200) and an upper pattern 230 (penetrating an upper portion or region of the interlayer insulating layer 200). The upper pattern 230 may protrude upwardly from, above, or higher than a top surface 200U of the interlayer insulating layer 200. In an implementation, the upper pattern 230 may protrude from or higher than (e.g., as measured from the top surface 100U of the substrate 100) the top surface 200U of the interlayer insulating layer 200 in a second direction D2 perpendicular to the top surface 100U of the substrate 100. In an implementation, the upper pattern 230 may include a first portion P1 penetrating or in the upper region of the interlayer insulating layer 200, and a second portion P2 protruding upwardly (e.g., in the second direction D2) from the top surface 200U of the interlayer insulating layer 200 (e.g., such that the first portion P1 is between the second portion P2 and the substrate 100 in the second direction D2). The second portion P2 of the upper pattern 230 may extend (e.g., laterally in the first direction D1) onto the top surface 200U of the interlayer insulating layer 200 to cover or overlie a portion of the top surface 200U of the interlayer insulating layer 200 (e.g., such that a portion of the interlayer insulating layer 200 is between the overlying part of the second portion P2 and the substrate 100 in the second direction D2). The second portion P2 of the upper pattern 230 may be referred to as a protrusion of the contact plug 250.

The upper pattern 230 may have a width in one direction parallel to the top surface 100U of the substrate 100, e.g., in the first direction D1. A width 230W1 of a lower portion or region (e.g., proximate to the substrate 100 in the second direction D2) of the second portion P2 of the upper pattern 230 may be greater than a width 230W2 of an upper portion or region (e.g., distal to the substrate 100 in the second direction D2) of the second portion P2. The lower region of the second portion P2 may be adjacent to the top surface 200U of the interlayer insulating layer 200, and the upper region of the second portion P2 may be spaced apart from the top surface 200U of the interlayer insulating layer 200 in the second direction D2. A width of the second portion P2 of the upper pattern 230 may become progressively less from its bottom toward its top (e.g., the width, as measured in the first direction D1, may get progressively smaller in the second direction D2). In an implementation, the width of the second portion P2 of the upper pattern 230 may decrease as a distance from the top surface 200U of the interlayer insulating layer 200 in the second direction D2 increases. In an implementation, the second portion P2 of the upper pattern 230 may have a shape tapered from the top surface 200U of the interlayer insulating layer 200 in the second direction D2, and an upper end of the second portion P2 may have a pointed shape or tip.

A width 230W3 (as measured in the first direction D1) of an upper region of the first portion P1 of the upper pattern 230 may be less than the width 230W1 of the lower region of the second portion P2 of the upper pattern 230. The upper region of the first portion P1 may be adjacent to the top surface 200U of the interlayer insulating layer 200. The lower region of the second portion P2 may protrude from or on the upper region of the first portion P1 in the direction parallel to the top surface 100U of the substrate 100, e.g., the first direction D1, and may cover a portion of the top surface 200U of the interlayer insulating layer 200.

The lower pattern 210 may be connected to the upper pattern 230, e.g., may be in direct contact with the upper pattern 230. The lower pattern 210 may be in direct contact with the first portion P1 of the upper pattern 230. In an implementation, an upper end of the lower pattern 210 may have a rounded shape convex toward the upper pattern 230 (e.g., in the second direction D2).

The contact plug 250 may further include a barrier pattern 220 between the lower pattern 210 and the interlayer insulating layer 200. The barrier pattern 220 may be between the lower pattern 210 and the substrate 100. In an implementation, a topmost surface 220U of the barrier pattern 220 (e.g., a surface of the barrier pattern 220 farthest from the substrate 100 in the second direction D2 and facing away from the substrate 100 in the second direction D2) may be located at a lower height (e.g., may be closer to the substrate 100 in the second direction D2) than a topmost surface 210U of the lower pattern 210 (e.g., a surface of the lower pattern 210 farthest from the substrate 100 in the second direction D2 and facing away from the substrate 100 in the second direction D2). In the present specification, the term 'height' means a vertical distance measured from the top surface 100U of the substrate 100 in the second direction D2. The upper pattern 230 may cover the topmost surface 220U of the barrier pattern 220. The topmost surface 220U of the barrier pattern 220 may be in direct contact with the first portion P1 of the upper pattern 230.

In an implementation, the lower pattern 210 may include a different material from that of the upper pattern 230. In an implementation, the lower pattern 210 may include a first metal (e.g., cobalt), and the upper pattern 230 may include a second metal (e.g., tungsten) different from the first metal. In an implementation, the lower pattern 210 and the upper pattern 230 may include the same material. In an implementation, the lower pattern 210 and the upper pattern 230 may include the same metal. In this case, the lower pattern 210 and the upper pattern 230 may be in contact with each other without an interface, e.g., to constitute a single unitary body. In an implementation, the barrier pattern 220 may include, e.g., a conductive metal nitride.

The conductive line 280 may include a line pattern 270 extending in the first direction D1 on the interlayer insulating layer 200, and a line barrier pattern 260 between the line pattern 270 and the interlayer insulating layer 200. The line barrier pattern 260 may extend between the upper pattern 230 of the contact plug 250 and the line pattern 270. The line barrier pattern 260 may extend between the second portion (e.g., the protrusion) P2 of the upper pattern 230 and the line pattern 270. The line barrier pattern 260 may cover (e.g., partially cover a portion of) the top surface 200U of the interlayer insulating layer 200. The line barrier pattern 260 may extend from the top surface 200U of the interlayer insulating layer 200 along a surface of the second portion P2 of the upper pattern 230 and may completely cover the surface of the second portion P2 of the upper pattern 230. The second portion P2 of the upper pattern 230 may be spaced apart from the line pattern 270 with the line barrier pattern 260 therebetween.

A topmost surface 230U of the upper pattern 230 may be located at a higher height than the top surface 200U of the interlayer insulating layer 200, and the line barrier pattern 260 may continuously extend from the top surface 200U of the interlayer insulating layer 200 onto and over the topmost surface 230U of the upper pattern 230. A maximum height (as measured in the second direction D2) of a bottom surface 260L (e.g., substrate 100-facing surface) of the line barrier pattern 260 that is on the upper pattern 230 may be higher than a height of the bottom surface 260L of the line barrier pattern 260 that is on the interlayer insulating layer 200. In an implementation, the line pattern 270 may include, e.g., a metal, and the line barrier pattern 260 may include, e.g., a conductive metal nitride.

In an implementation, the contact plug 250 may include the lower pattern 210 and the upper pattern 230 (in direct contact with the lower pattern 210). In an implementation, the upper pattern 230 may include the first portion P1 (penetrating or in the upper region of the interlayer insulating layer 200) and the second portion P2 (protruding upwardly from or above the top surface 200U of the interlayer insulating layer 200). The width 230W1 of the lower region of the second portion P2 may be greater than the width 230W3 of the upper region of the first portion P1. The contact plug 250 may include the second portion P2 of the upper pattern 230, and it is possible to prevent the line barrier pattern 260 from extending into the interlayer insulating layer 200. Thus, an electrical resistance of the contact plug 250 may be reduced. As a result, electrical characteristics of a semiconductor device including the contact plug 250 may be improved.

Figure 3A:
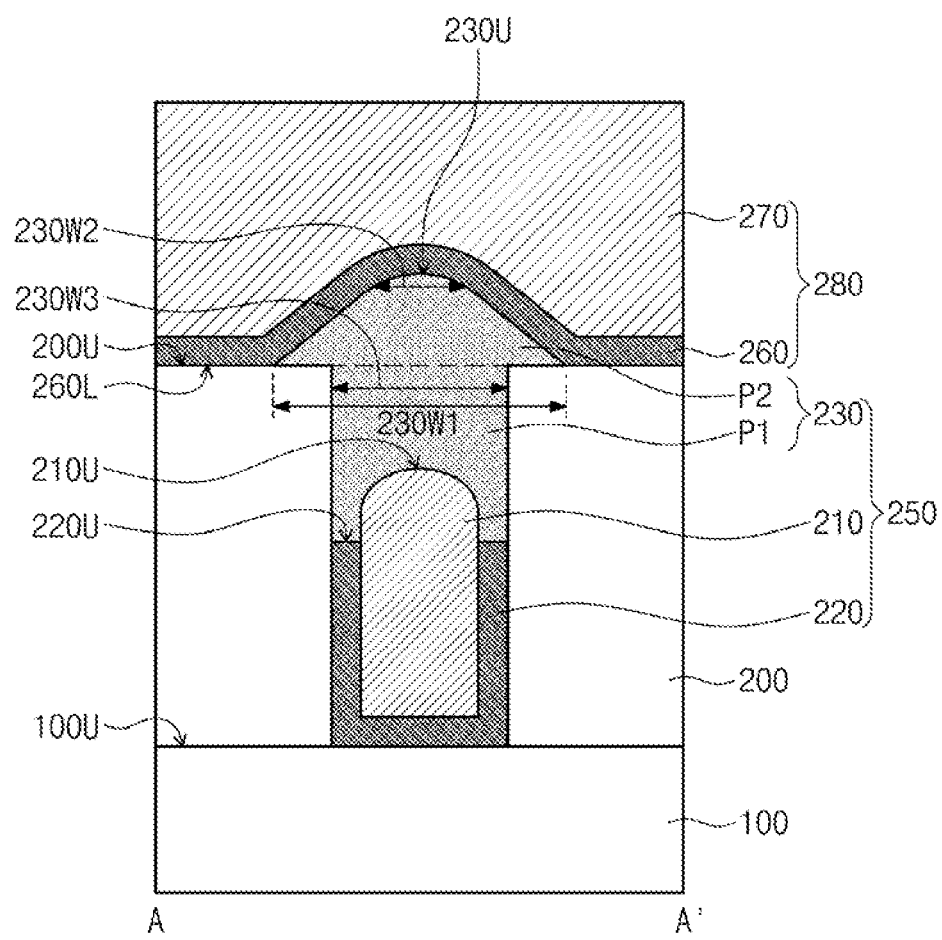
Figure 3B:
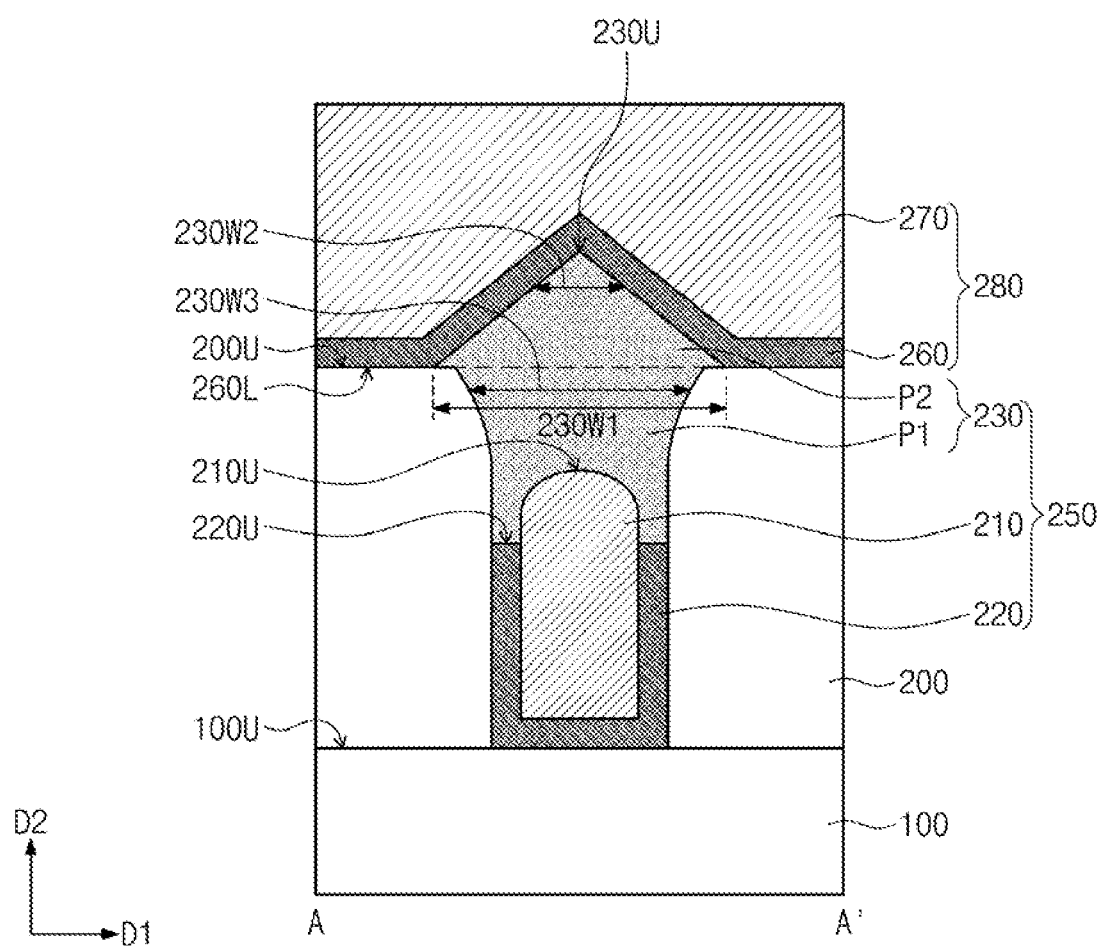

FIGS. 3A and 3B are cross-sectional views corresponding to the line A-A' of FIG. 1 to illustrate semiconductor devices according to some embodiments.

Referring to FIGS. 1 and 3A, a width 230W1 of a lower region of the second portion P2 of the upper pattern 230 may be greater than a width 230W2 of an upper region of the second portion P2. A width (e.g., as measured in the first direction D1) of the second portion P2 of the upper pattern 230 may become progressively less from its bottom toward its top (e.g., in the second direction D2). In an implementation, the width of the second portion P2 of the upper pattern 230 may decrease as a distance from the top surface 200U of the interlayer insulating layer 200 in the second direction D2 increases. In an implementation, an upper end of the second portion P2 of the upper pattern 230 may have a rounded shape convex toward the conductive line 280. Except for the differences described above, other components and features of the semiconductor device according to the present embodiments may be substantially the same as corresponding components and features of the semiconductor device described with reference to FIGS. 1 and 2.

Referring to FIGS. 1 and 3B, a width 230W3 (e.g., as measured in the first direction D1) of an upper region of the first portion P1 of the upper pattern 230 may become progressively greater toward the second portion P2 of the upper pattern 230 (e.g., in the second direction D2). In an implementation, the width 230W3 of the upper region of the first portion P1 of the upper pattern 230 may increase as a height in the second direction D2 increases. Except for the differences described above, other components and features of the semiconductor device according to the present embodiments may be substantially the same as corresponding components and features of the semiconductor device described with reference to FIGS. 1 and 2 (e.g., the width 230W3 of the upper region of the first portion P1 of the upper pattern 230 may still be less than the width 230W1 of the lower region of the second portion P2 of the upper pattern 230).

FIG. 4 is a cross-sectional view corresponding to the line A-A' of FIG. 1 to illustrate a semiconductor device according to some embodiments.

Referring to FIGS. 1 and 4, according to some embodiments, a topmost surface 220U of the barrier pattern 220 may be located at a higher height than a topmost surface 210U of the lower pattern 210 and may be located at a lower height than the top surface 200U of the interlayer insulating layer 200. The first portion P1 of the upper pattern 230 may cover the topmost surface 220U of the barrier pattern 220 and may be between inner sidewalls 220IS of the barrier pattern 220. The inner sidewalls 220IS of the barrier pattern 220 and the topmost surface 210U of the lower pattern 210 may be in direct contact with the first portion P1 of the upper pattern 230. The barrier pattern 220 may be between the lower pattern 210 and the interlayer insulating layer 200 and may be between a portion of the first portion P1 of the upper pattern 230 and the interlayer insulating layer 200. Except for the differences described above, other and features of the semiconductor device according to the present embodiments may be substantially the same as corresponding components and features of the semiconductor device described with reference to FIGS. 1 and 2.

Figure 5:
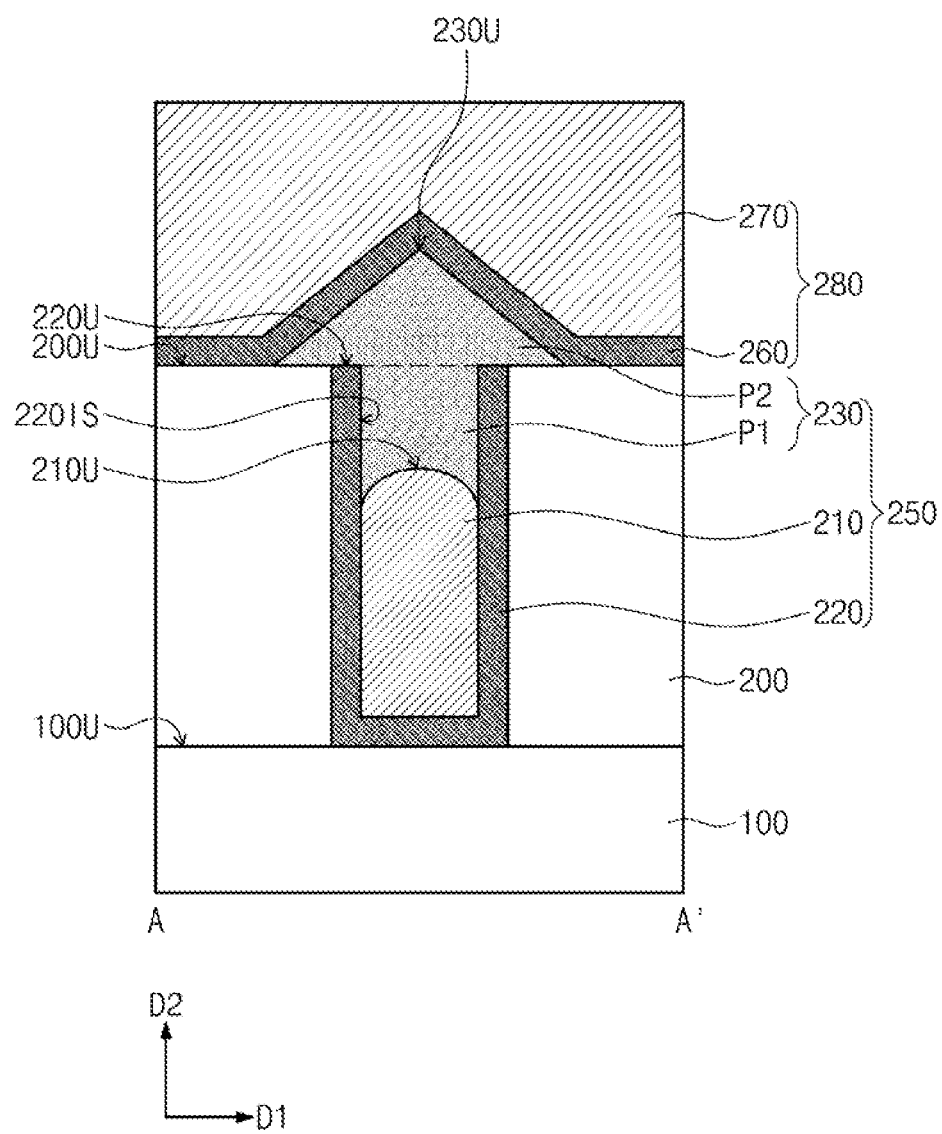

FIG. 5 is a cross-sectional view corresponding to the line A-A' of FIG. 1 to illustrate a semiconductor device according to some embodiments.

Referring to FIGS. 1 and 5, according to some embodiments, a topmost surface 220U of the barrier pattern 220 may be located at a higher height than a topmost surface 210U of the lower pattern 210 and may be located at substantially (e.g., accounting for process margins) the same height as the top surface 200U of the interlayer insulating layer 200 (e.g., the topmost surface 220U of the barrier pattern 220 may be coplanar with the top surface 200U of the interlayer insulating layer 200). The first portion P1 of the upper pattern 230 may be between inner sidewalls 220IS of the barrier pattern 220. The second portion P2 of the upper pattern 230 may cover the topmost surface 220U of the barrier pattern 220. The topmost surface 220U of the barrier pattern 220 may be in direct contact with the second portion P2 of the upper pattern 230, and the inner sidewalls 220IS of the barrier pattern 220 and the topmost surface 210U of the lower pattern 210 may be in direct contact with the first portion P1 of the upper pattern 230. The barrier pattern 220 may be between the lower pattern 210 and the interlayer insulating layer 200 and may be between the first portion P1 of the upper pattern 230 and the interlayer insulating layer 200. Except for the differences described above, other components and features of the semiconductor device according to the present embodiments may be substantially the same as corresponding components and features of the semiconductor device described with reference to FIGS. 1 and 2.

Figure 6:
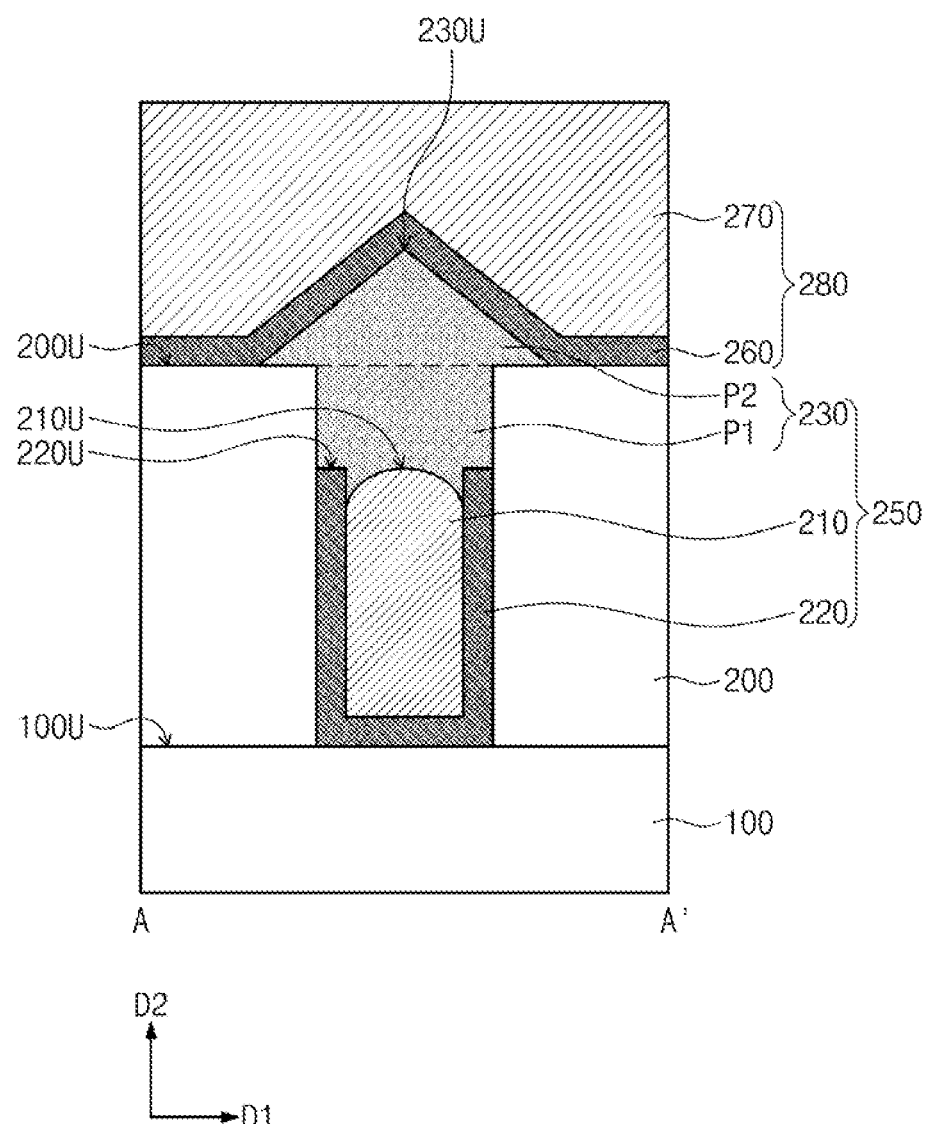

FIG. 6 is a cross-sectional view corresponding to the line A-A' of FIG. 1 to illustrate a semiconductor device according to some embodiments.

Referring to FIGS. 1 and 6, according to some embodiments, a topmost surface 220U of the barrier pattern 220 may be located at substantially the same height as a topmost surface 210U of the lower pattern 210. The topmost surface 220U of the barrier pattern 220 and the topmost surface 210U of the lower pattern 210 may be located at a lower height than the top surface 200U of the interlayer insulating layer 200. The topmost surface 220U of the barrier pattern 220 and the topmost surface 210U of the lower pattern 210 may be in direct contact with the first portion P1 of the upper pattern 230. Except for the differences described above, other components and features of the semiconductor device according to the present embodiments may be substantially the same as corresponding components and features of the semiconductor device described with reference to FIGS. 1 and 2.

FIGS. 7 to 10 are cross-sectional views corresponding to the line A-A' of FIG. 1 to illustrate semiconductor devices according to some embodiments.

Figure 7:
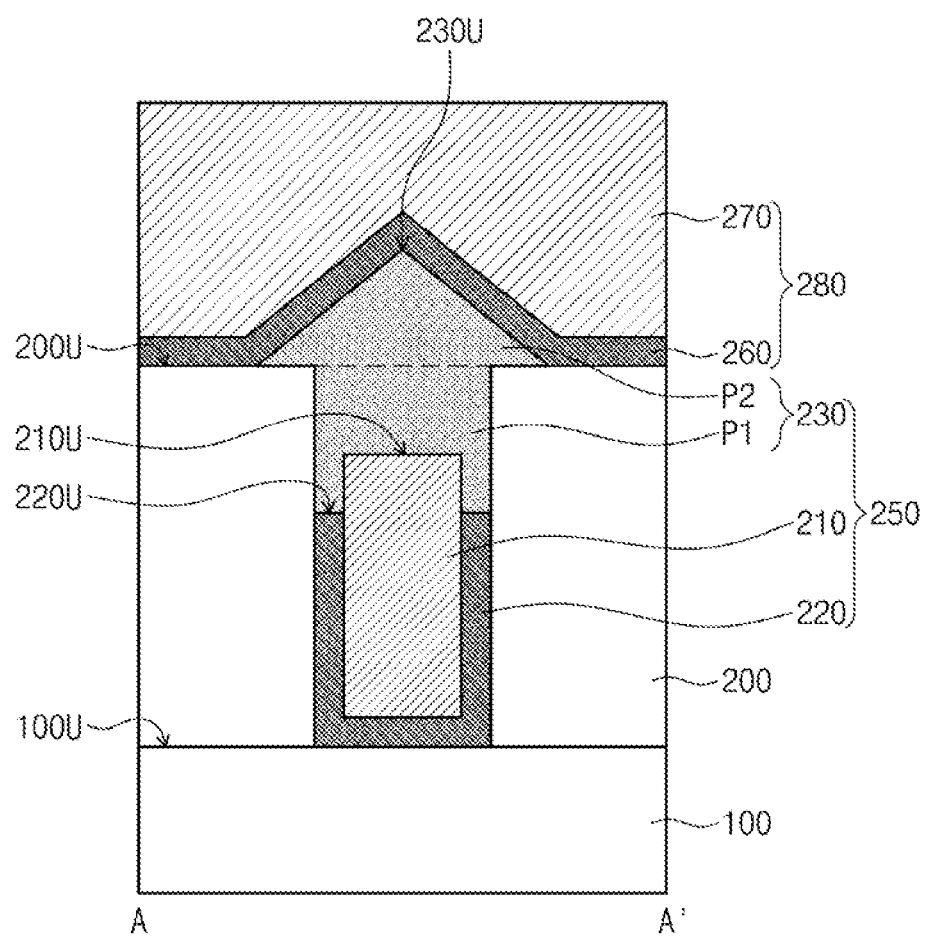
FIGS. 7 to 10 are cross-sectional views corresponding to the line A-A' of FIG. 1 to illustrate semiconductor devices according to some embodiments.

Referring to FIGS. 1 and 7, according to some embodiments, the lower pattern 210 may have a top surface 210U having a flat shape (e.g., different from the rounded shape described above). The topmost surface 220U of the barrier pattern 220 may be located at a lower height than the top surface 210U of the lower pattern 210. The topmost surface 220U of the barrier pattern 220 and the top surface 210U of the lower pattern 210 may be in direct contact with the first portion P1 of the upper pattern 230. Except for the differences described above, other components and features of the semiconductor device according to the present embodiments may be substantially the same as corresponding components and features of the semiconductor device described with reference to FIGS. 1 and 2.

Figure 8:
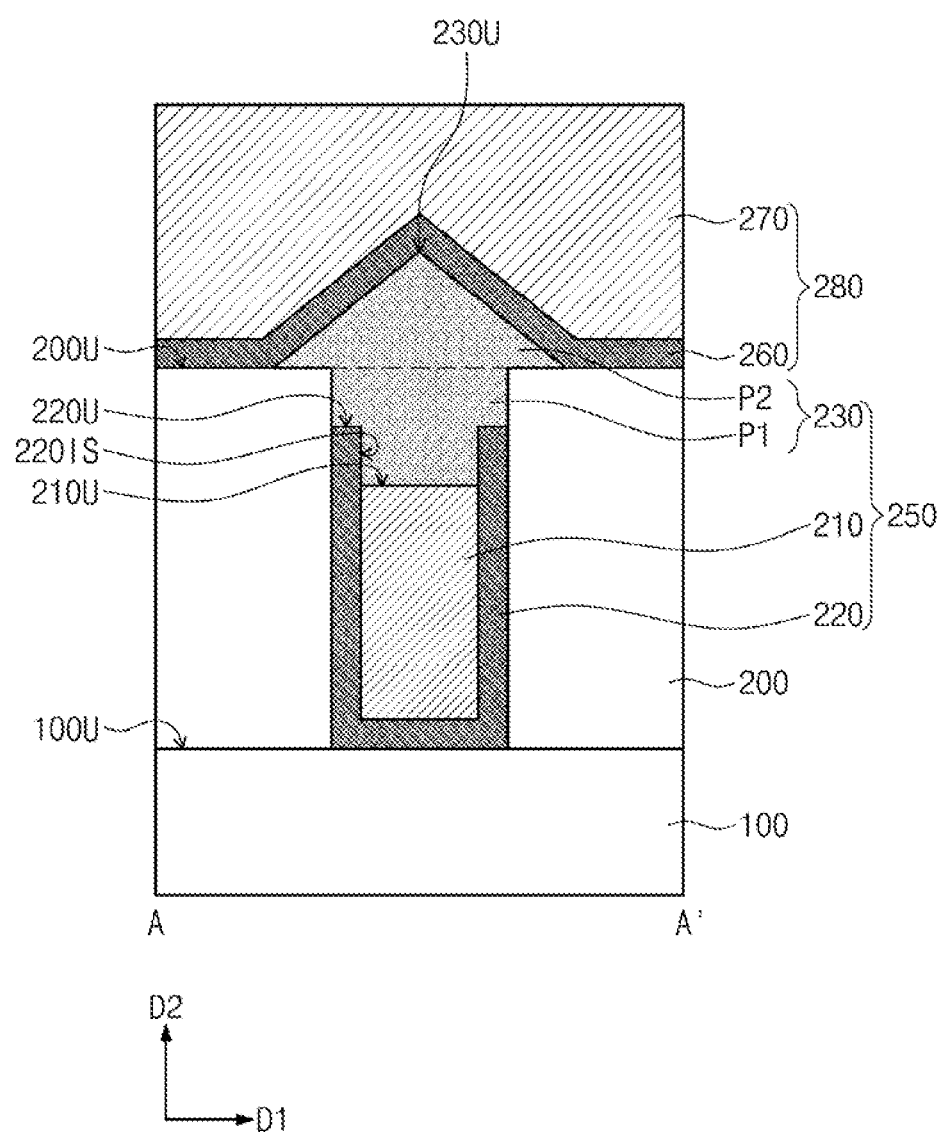

Referring to FIGS. 1 and 8, according to some embodiments, the lower pattern 210 may have a top surface 210U having a flat shape. The topmost surface 220U of the barrier pattern 220 may be located at a higher height than the top surface 210U of the lower pattern 210 and may be located at a lower height than the top surface 200U of the interlayer insulating layer 200. Except for the differences described above, other components and features of the semiconductor device according to the present embodiments may be substantially the same as corresponding components and features of the semiconductor device described with reference to FIGS. 1 and 4.

Figure 9:
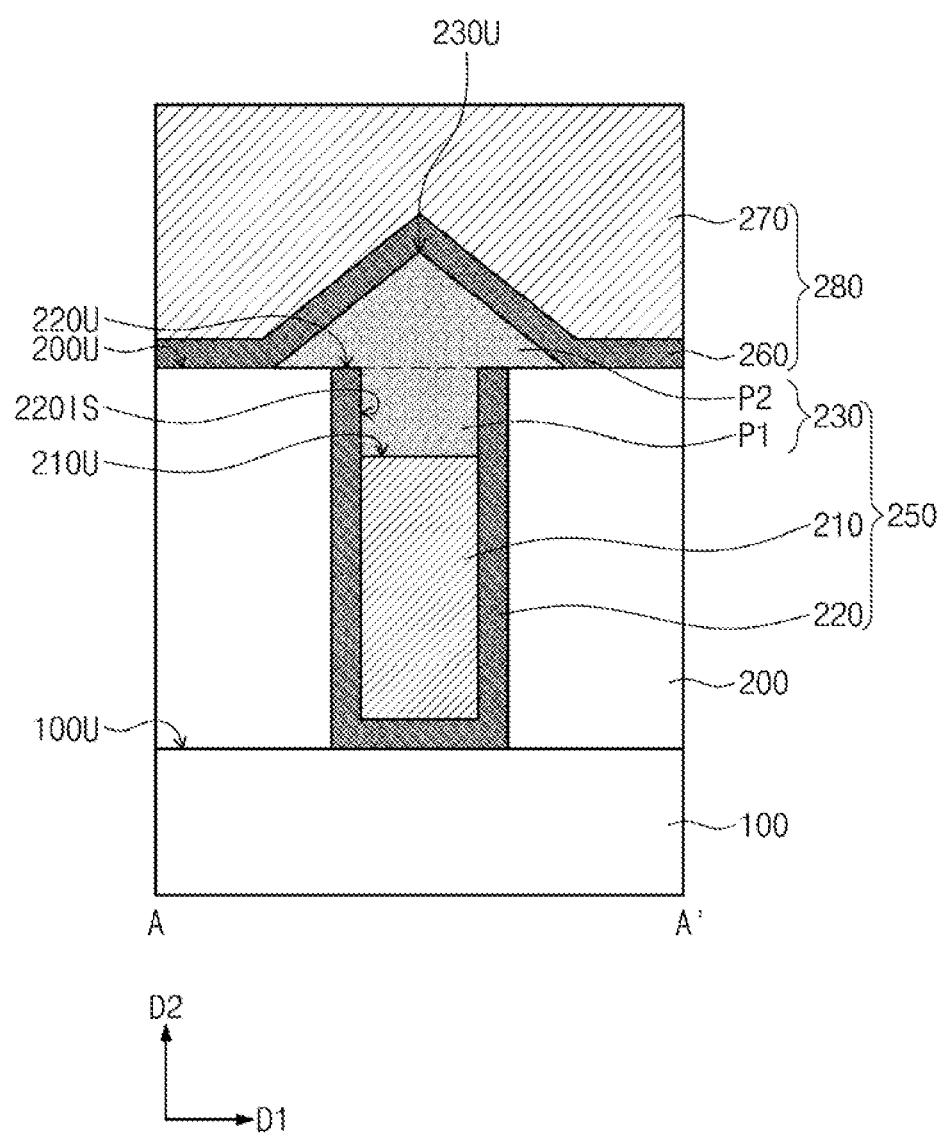

Referring to FIGS. 1 and 9, according to some embodiments, the lower pattern 210 may have a top surface 210U having a flat shape. The topmost surface 220U of the barrier pattern 220 may be located at a higher height than the top surface 210U of the lower pattern 210 and may be located at substantially the same height as the top surface 200U of the interlayer insulating layer 200. Except for the differences described above, other components and features of the semiconductor device according to the present embodiments may be substantially the same as corresponding components and features of the semiconductor device described with reference to FIGS. 1 and 5.

Figure 10:
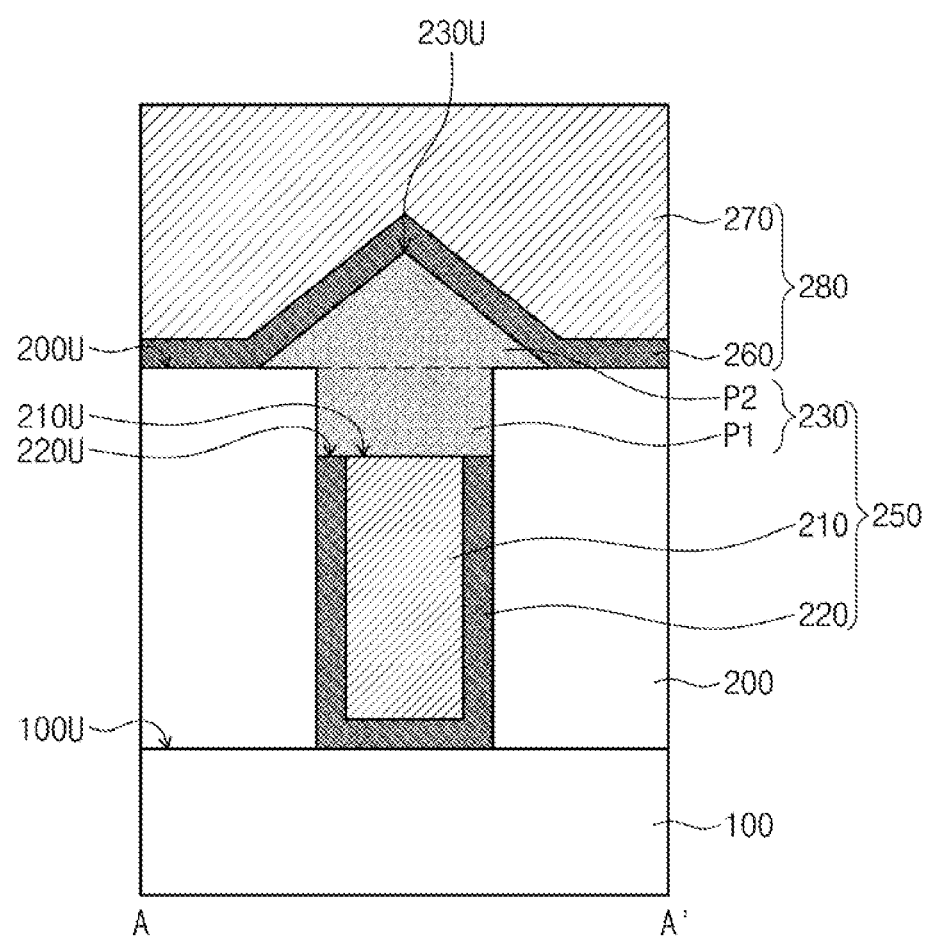

Referring to FIGS. 1 and 10, according to some embodiments, the lower pattern 210 may have a top surface 210U having a flat shape. The topmost surface 220U of the barrier pattern 220 may be located at substantially the same height as the top surface 210U of the lower pattern 210. The topmost surface 220U of the barrier pattern 220 and the top surface 210U of the lower pattern 210 may be located at a lower height than the top surface 200U of the interlayer insulating layer 200. Except for the differences described above, other components and features of the semiconductor device according to the present embodiments may be substantially the same as corresponding components and features of the semiconductor device described with reference to FIGS. 1 and 6.

Figure 11:
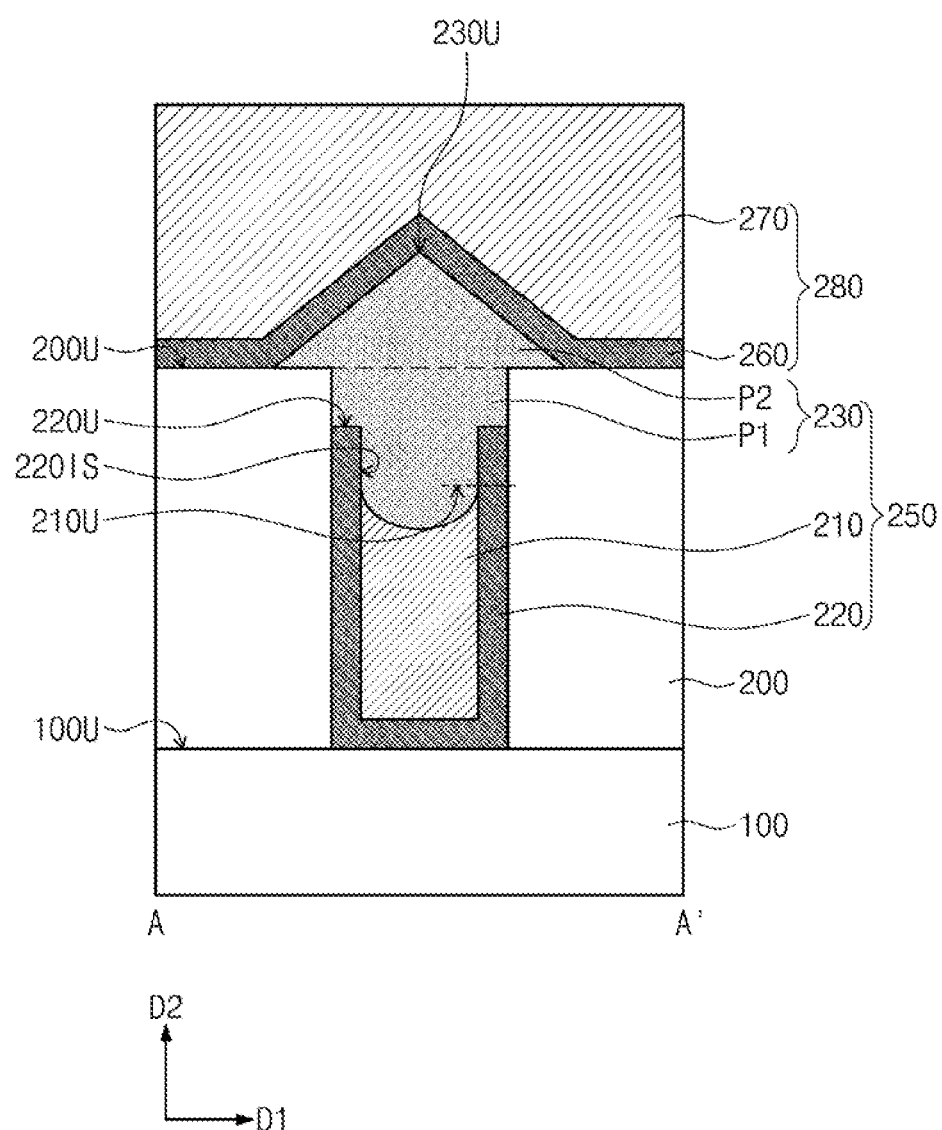
FIGS. 11 to 13 are cross-sectional views corresponding to the line A-A' of FIG. 1 to illustrate semiconductor devices according to some embodiments.
Figure 12:
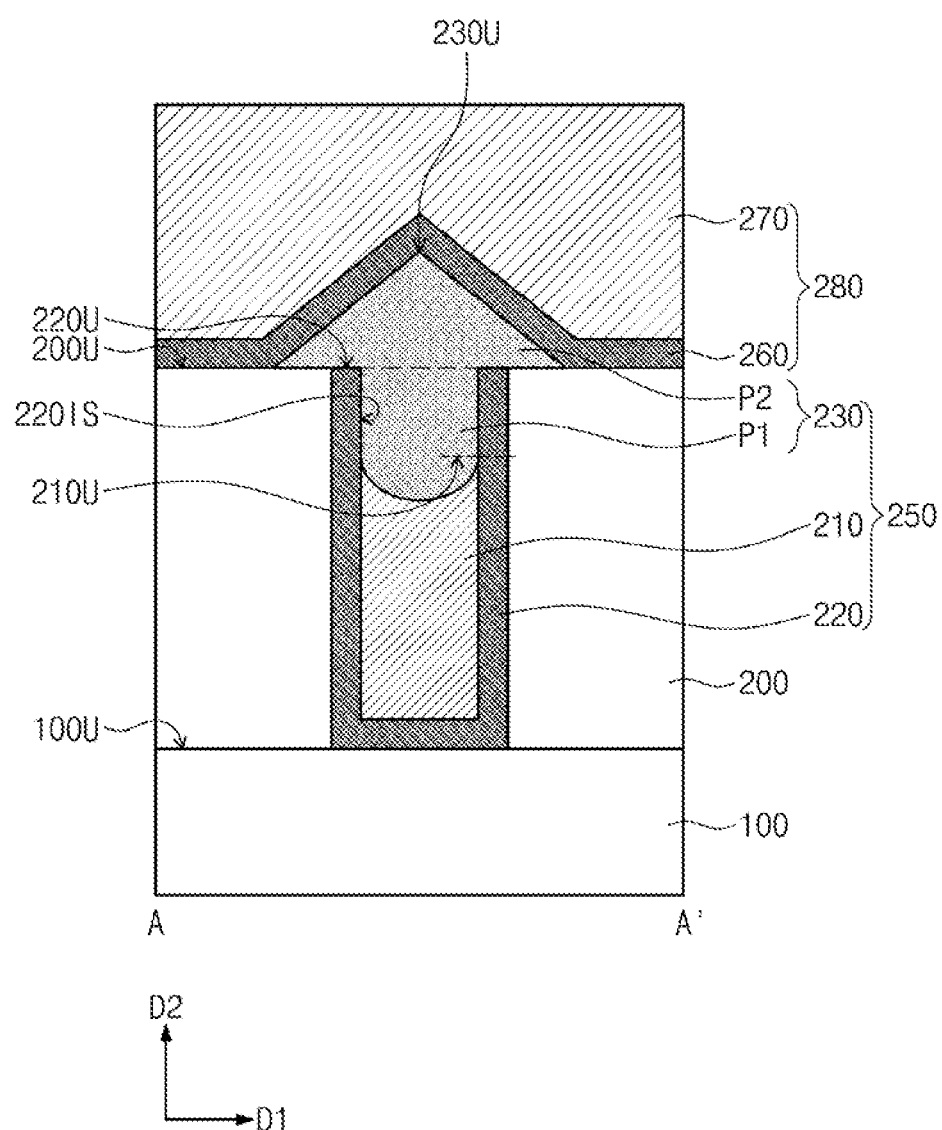
Figure 13:
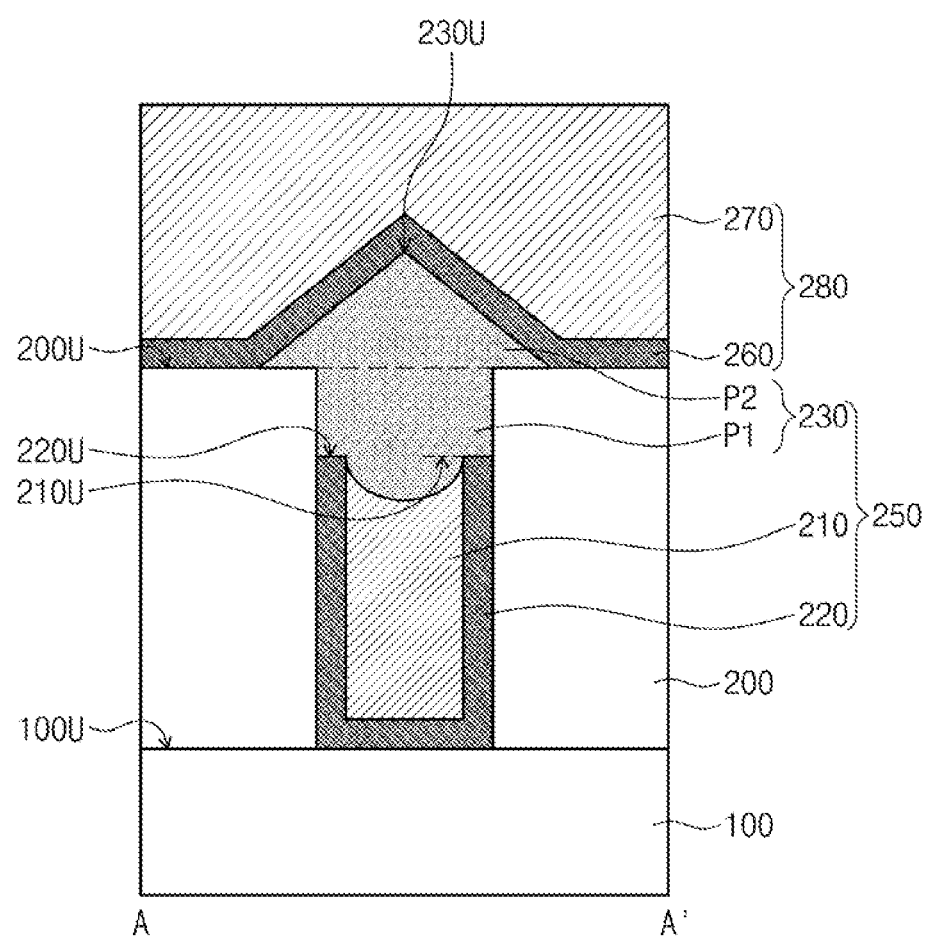

FIGS. 11 to 13 are cross-sectional views corresponding to the line A-A' of FIG. 1 to illustrate semiconductor devices according to some embodiments.

Referring to FIGS. 1 and 11, according to some embodiments, an upper end or side (e.g., surface that faces away from the substrate 100 in the second direction D2) of the lower pattern 210 may have a rounded shape that concave toward the inside of the lower pattern 210 (e.g., toward the substrate 100 in the second direction D2). The topmost surface 220U of the barrier pattern 220 may be located at a higher height than a plane (e.g., parallel to the top surface 100U of the substrate 100) of a topmost surface 210U of the lower pattern 210 and may be located at a lower height than the top surface 200U of the interlayer insulating layer 200. Except for the differences described above, other components and features of the semiconductor device according to the present embodiments may be substantially the same as corresponding components and features of the semiconductor device described with reference to FIGS. 1 and 4.

Referring to FIGS. 1 and 12, according to some embodiments, an upper end of the lower pattern 210 may have the rounded shape that is concave toward the inside of the lower pattern 210. The topmost surface 220U of the barrier pattern 220 may be located at a higher height than the plane of the topmost surface 210U of the lower pattern 210 and may be located at substantially the same height as the top surface 200U of the interlayer insulating layer 200. Except for the differences described above, other components and features of the semiconductor device according to the present embodiments may be substantially the same as corresponding components and features of the semiconductor device described with reference to FIGS. 1 and 5.

Referring to FIGS. 1 and 13, according to some embodiments, an upper end of the lower pattern 210 may have the rounded shape that concave toward the inside of the lower pattern 210. The topmost surface 220U of the barrier pattern 220 may be located at substantially the same height as the plane of the topmost surface 210U of the lower pattern 210. The topmost surface 220U of the barrier pattern 220 and the plane of the topmost surface 210U of the lower pattern 210 may be located at a lower height than the top surface 200U of the interlayer insulating layer 200. Except for the differences described above, other components and features of the semiconductor device according to the present embodiments may be substantially the same as corresponding components and features of the semiconductor device described with reference to FIGS. 1 and 6.

FIGS. 14 to 17 are cross-sectional views corresponding to the line A-A' of FIG. 1 to illustrate stages in a method for manufacturing a semiconductor device according to some embodiments. Hereinafter, the descriptions to the same technical features as described with reference to FIGS. 1 to 13 will be omitted or mentioned briefly for the purpose of ease and convenience in explanation.

Figure 14:
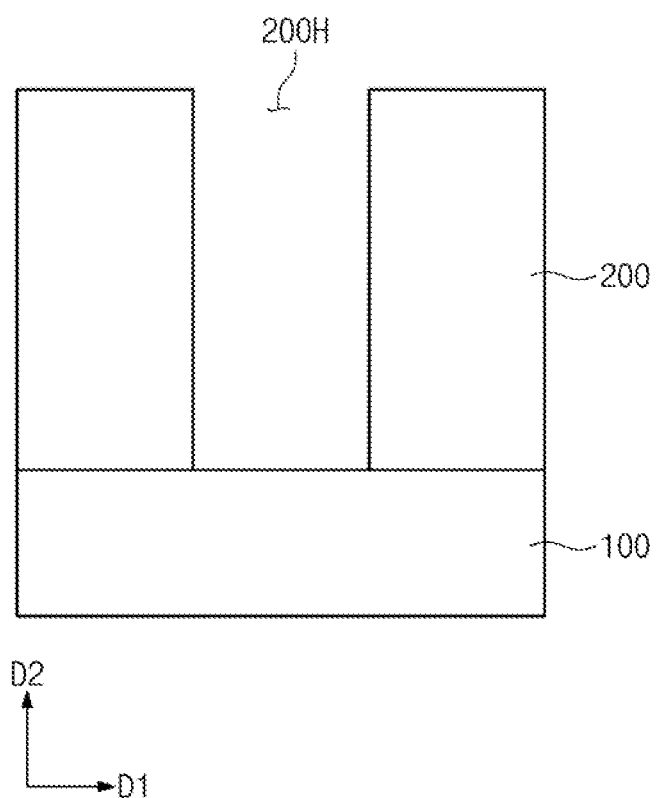
FIGS. 14 to 17 are cross-sectional views corresponding to the line A-A' of FIG. 1 to illustrate stages in a method for manufacturing a semiconductor device according to some embodiments.

Referring to FIGS. 1 and 14, an interlayer insulating layer 200 may be formed on a substrate 100, and a contact hole 200H may be formed to penetrate the interlayer insulating layer 200. In an implementation, the formation of the contact hole 200H may include forming a mask pattern defining a region, in which the contact hole 200H will be formed, on the interlayer insulating layer 200, anisotropically etching the interlayer insulating layer 200 using the mask pattern as an etch mask, and removing the mask pattern after the etching process.

Figure 15:
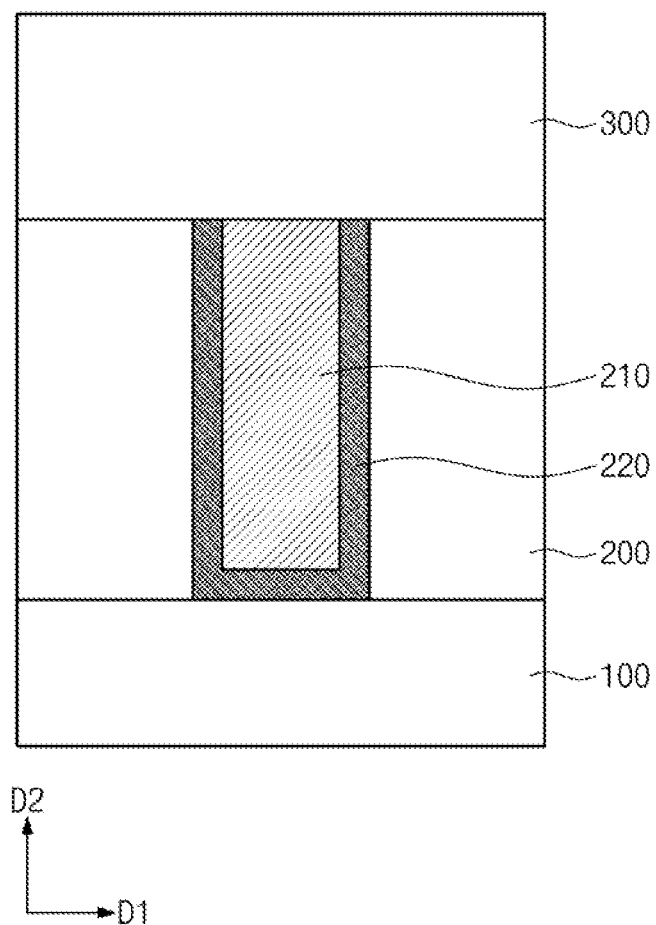

Referring to FIGS. 1 and 15, a lower pattern 210 and a barrier pattern 220 may be formed in the contact hole 200H. In an implementation, the formation of the lower pattern 210 and the barrier pattern 220 may include forming a barrier layer filling a portion of the contact hole 200H on the interlayer insulating layer 200, forming a lower layer filling a remaining portion of the contact hole 200H on the barrier layer, and planarizing the lower layer and the barrier layer until a top surface of the interlayer insulating layer 200 is exposed. The planarization of the lower layer and the barrier layer may include performing, e.g., an etch-back process or a chemical mechanical polishing (CMP) process. The lower pattern 210 and the barrier pattern 220 may be confined in the contact hole 200H by the planarization process. Thereafter, an upper insulating layer 300 may be formed on the interlayer insulating layer 200 and may cover topmost surfaces of the lower pattern 210 and the barrier pattern 220.

Figure 16:
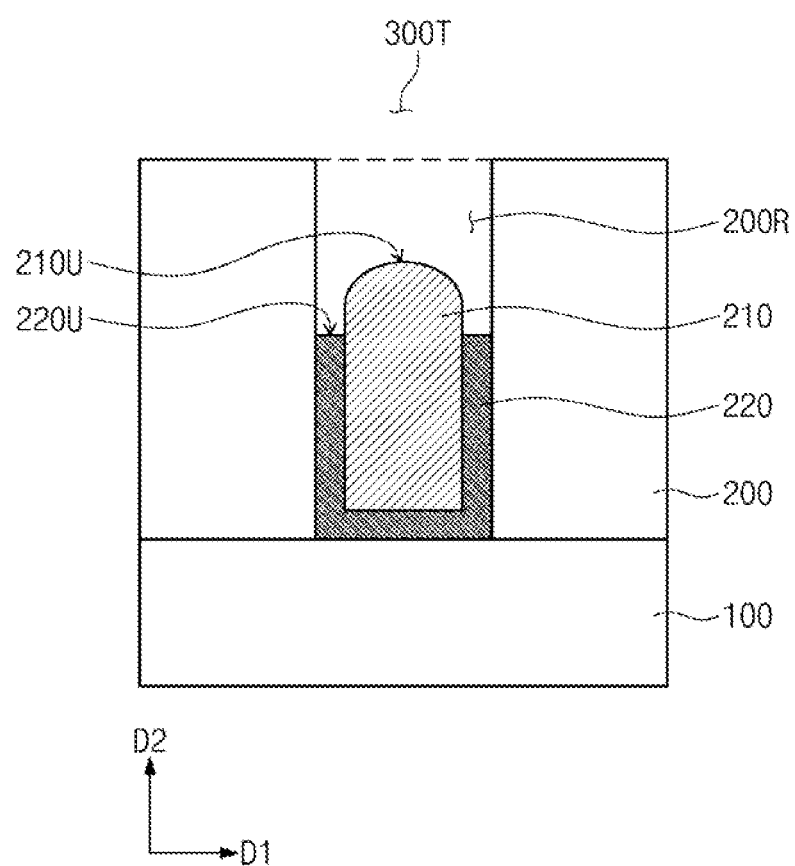

Referring to FIGS. 1 and 16, the upper insulating layer 300 may be patterned to form a trench 300T exposing the topmost surfaces of the lower pattern 210 and the barrier pattern 220. In an implementation, the formation of the trench 300T may include forming a mask pattern defining a region, in which the trench 300T will be formed, on the upper insulating layer 300, and etching the upper insulating layer 300 using the mask pattern as an etch mask. The etching of the upper insulating layer 300 may include performing a dry etching process and/or a wet etching process. The topmost surfaces of the lower pattern 210 and the barrier pattern 220 may be recessed during the etching process. In the etching process, etch selectivity of the lower pattern 210 and the barrier pattern 220 may be adjusted by controlling an etching source and/or an etching solution of the etching process. In an implementation, a shape of an upper end of the lower pattern 210, a height of a topmost surface (or a top surface) 210U of the lower pattern 210, and a height of a topmost surface 220U of the barrier pattern 220 may be variously modified as described with reference to FIGS. 1 to 13. The topmost surfaces of the lower pattern 210 and the barrier pattern 220 may be recessed, and a recess region 200R exposing the lower pattern 210 and the barrier pattern 220 may be formed in the interlayer insulating layer 200. In an implementation, an upper end of the interlayer insulating layer 200 may be over-etched during the etching process, and a width of an upper portion of the recess region 200R may become progressively greater toward a top of the recess region 200R, as illustrated in FIG. 3B.

Figure 17:
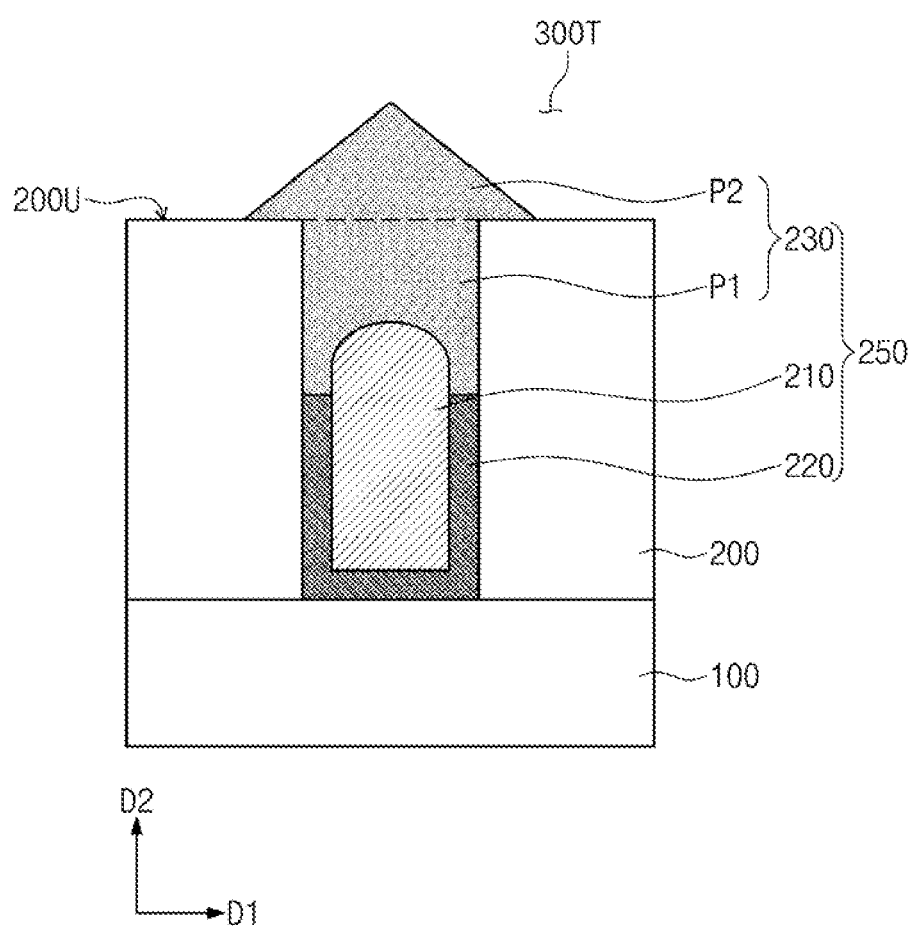

Referring to FIGS. 1 and 17, an upper pattern 230 may be formed to fill the recess region 200R. The formation of the upper pattern 230 may include performing a selective growth process using the lower pattern 210 and the barrier pattern 220, exposed by the recess region 200R, as a seed. In the selective growth process, the upper pattern 230 may be formed to fill the recess region 200R and a portion of the upper pattern 230 may protrude upwardly from or above a top surface 200U of the interlayer insulating layer 200. Thus, the upper pattern 230 may include a first portion P1 filling the recess region 200R, and a second portion P2 protruding upwardly from the top surface 200U of the interlayer insulating layer 200. The second portion P2 of the upper pattern 230 may have a shape that is tapered from the top surface 200U of the interlayer insulating layer 200 along the second direction D2. The lower pattern 210, the barrier pattern 220, and the upper pattern 230 may constitute a contact plug 250.

Referring again to FIGS. 1 and 2, a conductive line 280 may be formed on the interlayer insulating layer 200 in the trench 300T. The conductive line 280 may include a line pattern 270 extending in the first direction D1 on the interlayer insulating layer 200, and a line barrier pattern 260 between the line pattern 270 and the interlayer insulating layer 200. The formation of the conductive line 280 may include forming a line barrier layer filling a portion of the trench 300T, forming a line conductive layer filling a remaining portion of the trench 300T on the line barrier layer, and locally forming the line pattern 270 and the line barrier pattern 260 in the trench 300T by planarizing the line conductive layer and the line barrier layer.

Figure 18:
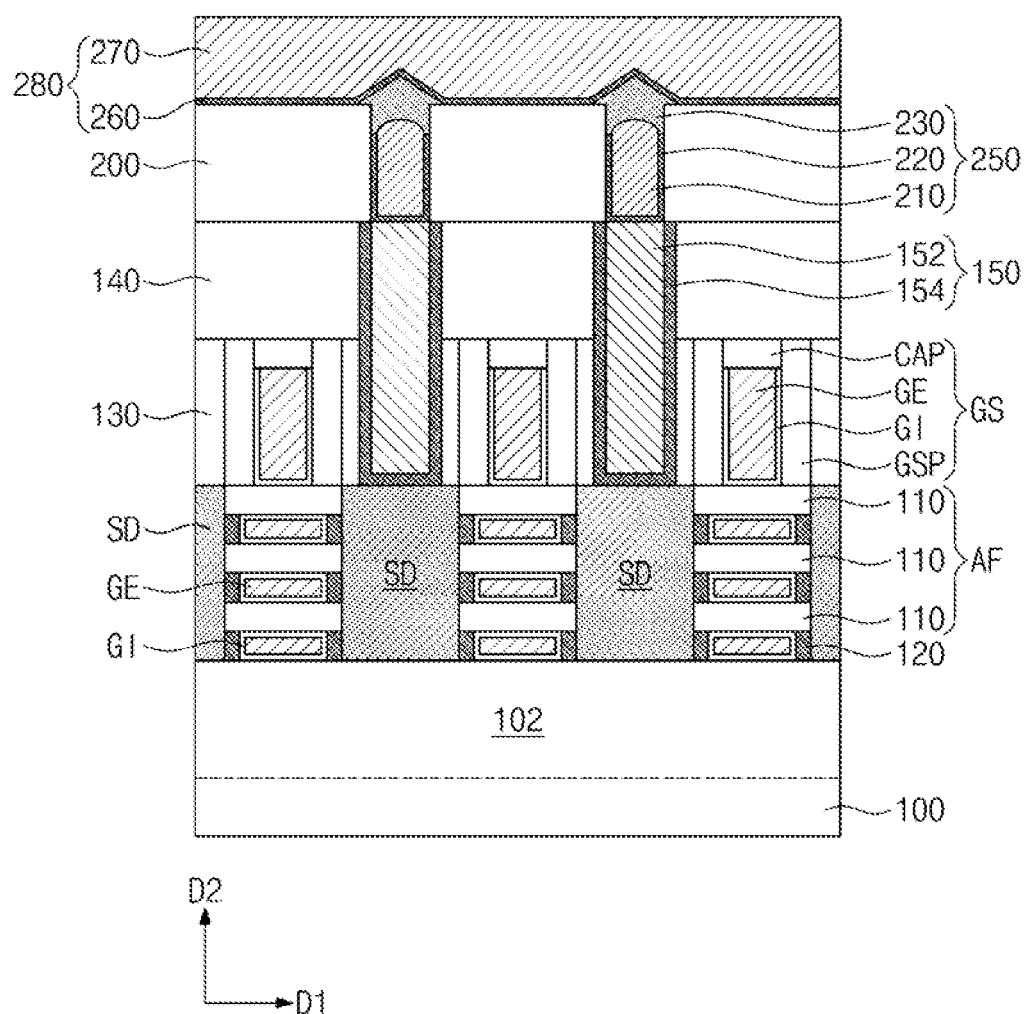
FIGS. 18 and 19 are cross-sectional views of semiconductor devices according to some embodiments.

FIG. 18 is a cross-sectional view illustrating a semiconductor device according to some embodiments.

Referring to FIG. 18, a substrate 100 including an active region 102 may be provided. The substrate 100 may be a semiconductor substrate. In an implementation, the substrate 100 may be a silicon substrate or a silicon-on-insulator (SOI) substrate. The active region 102 may extend in the first direction D1 parallel to a top surface 100U of the substrate 100 and may protrude upwardly from or on the substrate 100 in the second direction D2 perpendicular to the top surface 100U of the substrate 100. In an implementation, device isolation patterns may be on the substrate 100 to define the active region 102.

An active fin AF and source/drain patterns SD may be on the active region 102. The source/drain patterns SD may be spaced apart from each other in the first direction D1 with the active fin AF therebetween. In an implementation, the active fin AF may include a plurality of semiconductor patterns 110 spaced apart from each other in the second direction D2. A lowermost one of the semiconductor patterns 110 may be spaced apart from the active region 102 in the second direction D2. The semiconductor patterns 110 may be between the source/drain patterns SD and may be connected to the source/drain patterns SD. Each of the source/drain patterns SD may be in contact with sidewalls of the semiconductor patterns 110. Each of the semiconductor patterns 110 may connect the source/drain patterns SD to each other. In an implementation, the number of the semiconductor patterns 110 may be three, as shown in FIG. 18. In an implementation, the semiconductor patterns 110 may include silicon (Si), silicon-germanium (SiGe), or germanium (Ge).

The source/drain patterns SD may include epitaxial patterns formed using the semiconductor patterns 110 and the active region 102 as a seed. The source/drain patterns SD may include, e.g., silicon-germanium (SiGe), silicon (Si), or silicon carbide (SiC). In an implementation, the source/drain patterns SD may provide tensile strain to the active fin AF. In an implementation, when the semiconductor patterns 110 include silicon (Si), the source/drain patterns SD may include silicon (Si) and/or silicon carbide (SiC). In an implementation, the source/drain patterns SD may provide compressive strain to the active fin AF. In an implementation, when the semiconductor patterns 110 include silicon (Si), the source/drain patterns SD may include silicon-germanium (SiGe). The source/drain patterns SD may further include dopants. The dopants may be employed to improve electrical characteristics of a transistor including the source/drain patterns SD. When the transistor is an N-channel metal-oxide-semiconductor field effect transistor (NMOSFET), the dopants may include, e.g., phosphorus (P). When the transistor is a P-channel metal-oxide-semiconductor field effect transistor (PMOSFET), the dopants may include, e.g., boron (B).

A gate structure GS may be on the active fin AF and may intersect the active fin AF. The active fin AF may overlap with the gate structure GS, and the source/drain patterns SD may be at both sides of the gate structure GS, respectively.

The gate structure GS may include a gate electrode GE, a gate insulating pattern GI between the gate electrode GE and the active fin AF, gate spacers GSP on sidewalls of the gate electrode GE, and a gate capping pattern CAP on a top surface of the gate electrode GE. The gate insulating pattern GI may extend between the gate electrode GE and the gate spacers GSP, and a topmost surface of the gate insulating pattern GI may be substantially coplanar with the top surface of the gate electrode GE. The gate electrode GE may cover a topmost surface of the active fin AF and may fill a space between the active fin AF and the active region 102 and spaces between the semiconductor patterns 110. The gate insulating pattern GI may be between the gate electrode GE and each of the semiconductor patterns 110. Each of the semiconductor patterns 110 may be spaced apart from the gate electrode GE with the gate insulating pattern GI interposed therebetween. The gate electrode GE, the active fin AF, and the source/drain patterns SD may constitute a multi-bridge channel field effect transistor (MBC FET).

The gate electrode GE may include a doped semiconductor material, a conductive metal nitride, or a metal. The gate insulating pattern GI may include a silicon oxide layer, a silicon nitride layer, a silicon oxynitride layer, or a high-k dielectric layer. The high-k dielectric layer may include a material of which a dielectric constant is higher than that of a silicon oxide layer. In an implementation, the high-k dielectric layer may include a hafnium oxide (HfO) layer, an aluminum oxide (AlO) layer, or a tantalum oxide (TaO)

layer. Each of the gate capping pattern CAP and the gate spacers GSP may include a silicon oxide layer, a silicon nitride layer, or a silicon oxynitride layer.

Spacer patterns 120 may be between each of the source/drain patterns SD and the gate electrode GE. The spacer patterns 120 may be at each side of the gate electrode GE and may be spaced apart from each other in the second direction D2. The spacer patterns 120 and the semiconductor patterns 110 may be alternately and repeatedly stacked in the second direction D2. Each of the spacer patterns 120 may be between the semiconductor patterns 110 vertically adjacent to each other or between the lowermost semiconductor pattern 110 and the active region 102. Each of the source/drain patterns SD may be in contact with the semiconductor patterns 110 and may be spaced apart from the gate electrode GE with the spacer patterns 120 therebetween. The gate insulating pattern GI may be between the gate electrode GE and each of the semiconductor patterns 110 and may extend between the gate electrode GE and each of the spacer patterns 120. Each of the spacer patterns 120 may be in contact with the gate insulating pattern GI.

A first interlayer insulating layer 130 may be on the substrate 100 and may cover the gate structure GS and the source/drain patterns SD. In an implementation, the first interlayer insulating layer 130 may include a silicon oxide layer, a silicon nitride layer, a silicon oxynitride layer, or a low-k dielectric layer. A top surface of the gate capping pattern CAP may be substantially coplanar with a top surface of the first interlayer insulating layer 130. The gate spacer GSP may be between the gate capping pattern CAP and the first interlayer insulating layer 130. A second interlayer insulating layer 140 may be on the first interlayer insulating layer 130 and may cover the top surface of the gate capping pattern CAP. In an implementation, the second interlayer insulating layer 140 may include a silicon oxide layer, a silicon nitride layer, a silicon oxynitride layer, or a low-k dielectric layer. In the present specification, the first and second interlayer insulating layers 130 and 140 may be referred to as a lower interlayer insulating layer.

Lower contact plugs 150 may penetrate the first and second interlayer insulating layers 130 and 140 so as to be electrically connected to the source/drain patterns SD. The lower contact plugs 150 may be at both sides of the gate structure GS, and each of the lower contact plugs 150 may be connected to a corresponding one of the source/drain patterns SD. Each of the lower contact plugs 150 may include a conductive pattern 152 penetrating the first and second interlayer insulating layers 130 and 140, and a contact barrier pattern 154 extending along a sidewall and a bottom surface of the conductive pattern 152. The contact barrier pattern 154 may be between the conductive pattern 152 and the first interlayer insulating layer 130 and between the conductive pattern 152 and the second interlayer insulating layer 140, and may extend between the conductive pattern 152 and the corresponding source/drain pattern SD. The conductive pattern 152 may include a metal, and the contact barrier pattern 154 may include a conductive metal nitride.

A third interlayer insulating layer 200 may be on the second interlayer insulating layer 140. The third interlayer insulating layer 200 may be substantially the same as the interlayer insulating layer 200 described with reference to FIGS. 1 to 13. In the present specification, the third interlayer insulating layer 200 may be referred to as an upper interlayer insulating layer.

A conductive line 280 may be on the third interlayer insulating layer 200. A contact plug 250 may penetrate the third interlayer insulating layer 200 and may be connected to the conductive line 280. The contact plug 250 may penetrate the third interlayer insulating layer 200 so as to be connected to a corresponding one of the lower contact plugs 150. The conductive line 280 and the contact plug 250 may be substantially the same as the conductive line 280 and the contact plug 250 in at least one of the embodiments described with reference to FIGS. 1 to 13.

Figure 19:
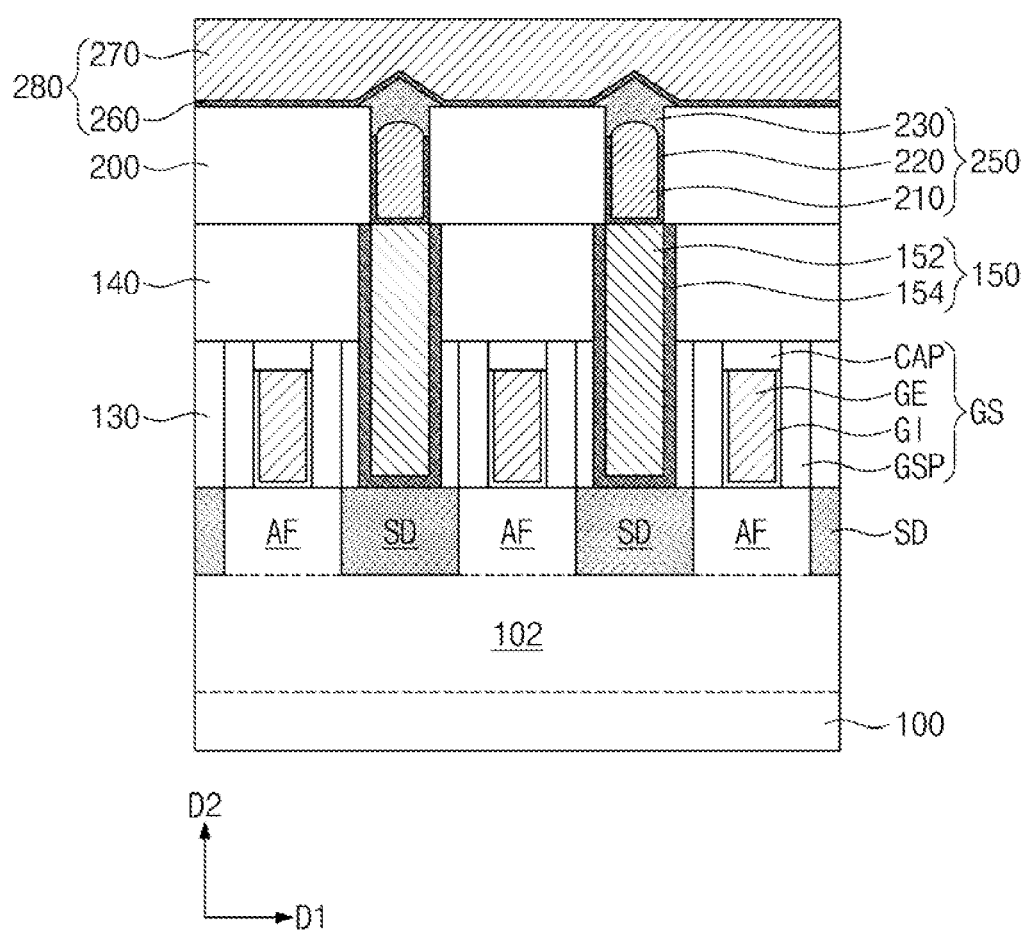

FIG. 19 is a cross-sectional view illustrating a semiconductor device according to some embodiments. Hereinafter, differences between the present embodiments and the above embodiments described with reference to FIG. 18 will be mainly described for the purpose of ease and convenience in explanation.

Referring to FIG. 19, a substrate 100 including an active region 102 may be provided. The active region 102 may extend in a first direction D1 parallel to a top surface 100U of the substrate 100 and may protrude upwardly from the substrate 100 in a second direction D2 perpendicular to the top surface 100U of the substrate 100. In an implementation, device isolation patterns may be on the substrate 100 to define the active region 102.

An active fin AF and source/drain patterns SD may be on the active region 102. The source/drain patterns SD may be spaced apart from each other in the first direction D1 with the active fin AF therebetween. In an implementation, the active fin AF may be an upper portion of the active region 102, which is exposed by the device isolation patterns. The source/drain patterns SD may include epitaxial patterns formed using the active fin AF and the active region 102 as a seed.

A gate structure GS may be on the active fin AF and may intersect the active fin AF. The active fin AF may overlap with the gate structure GS, and the source/drain patterns SD may be at both sides of the gate structure GS, respectively. In an implementation, the active fin AF may have sidewalls opposite to each other in a third direction which is parallel to the top surface 100U of the substrate 100 and is perpendicular to the first direction D1, and the gate structure GS may cover the opposite sidewalls of the active fin AF. The gate electrode GE, the active fin AF and the source/drain patterns SD may constitute a fin field effect transistor (Fin FET).

A first interlayer insulating layer 130 may be on the substrate 100 and may cover the gate structure GS and the source/drain patterns SD. A second interlayer insulating layer 140 may be on the first interlayer insulating layer 130. In the present specification, the first and second interlayer insulating layers 130 and 140 may be referred to as a lower interlayer insulating layer. Lower contact plugs 150 may penetrate the first and second interlayer insulating layers 130 and 140 so as to be electrically connected to the source/drain patterns SD.

A third interlayer insulating layer 200 may be on the second interlayer insulating layer 140. The third interlayer insulating layer 200 may be substantially the same as the interlayer insulating layer 200 described with reference to FIGS. 1 to 13. In the present specification, the third interlayer insulating layer 200 may be referred to as an upper interlayer insulating layer.

A conductive line 280 may be on the third interlayer insulating layer 200. A contact plug 250 may penetrate the third interlayer insulating layer 200 and may be connected to the conductive line 280. The contact plug 250 may penetrate the third interlayer insulating layer 200 so as to be connected to a corresponding one of the lower contact plugs 150. The conductive line 280 and the contact plug 250 may be substantially the same as the conductive line 280 and the contact plug 250 in at least one of the embodiments described with reference to FIGS. 1 to 13.

According to the present embodiments, the contact plug 250 may include a lower pattern 210 and an upper pattern 230 (in direct contact with the lower pattern 210), and the upper pattern 230 may include a protrusion protruding upwardly from a top surface of the third interlayer insulating layer 200. Thus, it is possible to prevent a line barrier pattern 260 from extending into the third interlayer insulating layer 200. As a result, an electrical resistance of the contact plug 250 may be reduced. Therefore, electrical characteristics of a semiconductor device including the contact plug 250 may be improved.

By way of summation and review, operating characteristics of semiconductor devices could be deteriorated by reduction in size of MOSFETs. Various methods for forming semiconductor devices that have excellent performance while overcoming limitations by the high integration have been considered.

One or more embodiments may provide a semiconductor device including a field effect transistor.

One or more embodiments may provide a semiconductor device with improved electrical characteristics.

According to the embodiments, the electrical resistance of the contact plug may be reduced, and thus the electrical characteristics of the semiconductor device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an interlayer insulating layer on a substrate;
a conductive line on the interlayer insulating layer; and
a contact plug penetrating the interlayer insulating layer, the contact plug being connected to the conductive line, wherein:
the contact plug includes:
a lower pattern penetrating a lower region of the interlayer insulating layer,
an upper pattern penetrating an upper region of the interlayer insulating layer, the lower pattern being connected to the upper pattern; and
a barrier pattern between the lower pattern and the interlayer insulating layer
the upper pattern covers a topmost surface of the barrier pattern and includes a protrusion protruding upwardly from a top surface of the interlayer insulating layer,
the protrusion has a width in a direction parallel to a top surface of the substrate, and a width of a lower region of the protrusion is greater than a width of an upper region of the protrusion.

2. The semiconductor device as claimed in claim 1, wherein:
the upper pattern includes a first metal, and
the lower pattern includes a second metal different from the first metal.

3. The semiconductor device as claimed in claim 1, wherein the upper pattern and the lower pattern include a same metal.

4. The semiconductor device as claimed in claim 1, wherein the lower pattern is in direct contact with the upper pattern.

5. The semiconductor device as claimed in claim 1, wherein the topmost surface of the barrier pattern is located at a lower height from the substrate than or substantially the same height as a topmost surface of the lower pattern.

6. The semiconductor device as claimed in claim 1, wherein the topmost surface of the barrier pattern is located at a higher height from the substrate than a topmost surface of the lower pattern and is located at a lower height from the substrate than the top surface of the interlayer insulating layer.

7. The semiconductor device as claimed in claim 1, wherein the barrier pattern extends between at least a portion of the upper pattern and the interlayer insulating layer.

8. The semiconductor device as claimed in claim 1, wherein:
the conductive line includes:
a line pattern extending in one direction on the interlayer insulating layer; and
a line barrier pattern between the line pattern and the interlayer insulating layer,
a topmost surface of the protrusion is located at a higher height from the substrate than the top surface of the interlayer insulating layer, and
the line barrier pattern extends from the top surface of the interlayer insulating layer onto the topmost surface of the protrusion.

9. A semiconductor device, comprising:
an interlayer insulating layer on a substrate;
a conductive line on the interlayer insulating layer; and
a contact plug penetrating the interlayer insulating layer, the contact plug being connected to the conductive line, wherein:
the contact plug includes a protrusion protruding upwardly from a top surface of the interlayer insulating layer,
the conductive line includes:
a line pattern extending in one direction on the interlayer insulating layer; and
a line barrier pattern between the line pattern and the interlayer insulating layer,
a topmost surface of the protrusion is located at a higher height from the substrate than the top surface of the interlayer insulating layer, and
the line barrier pattern extends from the top surface of the interlayer insulating layer onto the topmost surface of the protrusion.

10. The semiconductor device as claimed in claim 9, wherein:
the protrusion has a width in a direction parallel to a top surface of the substrate, and
a width of a lower region of the protrusion is greater than a width of an upper region of the protrusion.

11. The semiconductor device as claimed in claim 10, wherein the lower region of the protrusion extends on the top surface of the interlayer insulating layer.

12. The semiconductor device as claimed in claim 10, wherein the width of the protrusion becomes progressively lower from a bottom of the protrusion toward a top of the protrusion.

13. The semiconductor device as claimed in claim 9, wherein the contact plug includes:
- an upper pattern penetrating an upper region of the interlayer insulating layer, the upper pattern including the protrusion;
- a lower pattern penetrating a lower region of the interlayer insulating layer, the lower pattern being connected to the upper pattern; and
- a barrier pattern between the lower pattern and the interlayer insulating layer.

14. The semiconductor device as claimed in claim 13, wherein the upper pattern covers a topmost surface of the barrier pattern.

15. The semiconductor device as claimed in claim 14, wherein the topmost surface of the barrier pattern is located at a lower height from the substrate than or substantially the same height as a topmost surface of the lower pattern.

16. The semiconductor device as claimed in claim 14, wherein the topmost surface of the barrier pattern is located at a higher height from the substrate than a topmost surface of the lower pattern and is located at a lower height from the substrate than the top surface of the interlayer insulating layer.

17. The semiconductor device as claimed in claim 14, wherein the barrier pattern extends between at least a portion of the upper pattern and the interlayer insulating layer.

18. A semiconductor device, comprising:
- an active fin on a substrate, the active fin including a plurality of semiconductor patterns spaced apart from each other in a first direction perpendicular to a top surface of the substrate;
- a gate electrode on the active fin, the gate electrode covering a topmost surface of the active fin and extends between the plurality of semiconductor patterns;
- an interlayer insulating layer on the gate electrode;
- a conductive line on the interlayer insulating layer; and
- a contact plug penetrating the interlayer insulating layer, the contact plug being connected to the conductive line, wherein:
- the contact plug includes a protrusion protruding upwardly from a top surface of the interlayer insulating layer, and
- the protrusion has a width in a second direction parallel to the top surface of the substrate, and a width of a lower region of the protrusion is greater than a width of an upper region of the protrusion.

19. The semiconductor device as claimed in claim 18, wherein the lower region of the protrusion extends on the top surface of the interlayer insulating layer.

20. The semiconductor device as claimed in claim 18, further comprising;
- source/drain patterns spaced apart from each other in the second direction with the active fin therebetween;
- a first interlayer insulating layer covering the gate electrode and the source/drain patterns;
- a second interlayer insulating layer on the first interlayer insulating layer; and
- a lower contact plug at a side of the gate electrode, the lower contact plug penetrating the first and second interlayer insulating layers and being electrically connected to a corresponding one of the source/drain patterns, wherein the interlayer insulating layer is on the second interlayer insulating layer, and wherein the contact plug penetrates the interlayer insulating layer and is electrically connected to the lower contact plug.

* * * * *